United States Patent [19]

Ford et al.

[11] 4,388,615

[45] Jun. 14, 1983

[54] TESTING EMERGENCY BATTERY EQUIPMENT

[76] Inventors: Barry S. Ford, 21 Park Rd., Ducklington, Witney, Oxfordshire; Sydney Birkett, Old School, Minster Lovell, Oxfordshire, both of England

[21] Appl. No.: 240,989

[22] Filed: Mar. 5, 1981

[51] Int. Cl.³ .................. G08B 29/00; G08B 21/00
[52] U.S. Cl. .................................. 340/516; 307/66; 340/636
[58] Field of Search ............... 340/636, 515, 516, 510, 340/506; 320/48; 307/64, 66; 324/429

[56] References Cited

U.S. PATENT DOCUMENTS 4,275,351  6/1981  Härer et al. .................. 324/429 X

FOREIGN PATENT DOCUMENTS 1535216  12/1978  United Kingdom .............. 340/515

*Primary Examiner*—John W. Caldwell, Sr.
*Assistant Examiner*—Daniel Myer
*Attorney, Agent, or Firm*—Larson and Taylor

[57] ABSTRACT

Stand-by battery equipment which is designed to come into use when the mains supply fails, is tested by disconnecting the mains supply at regular intervals by contact 14 under the control of timing device 21. After a delay caused by timing device 23, a light sensor 15 is activated for a time period controlled by timing device 24 to check whether the light output of the battery equipment has reached a desired level, and if it has not it causes an alarm lamp 16 to be illuminated until reset. A timing device 22 causes an extra long test to be carried out after a number of short tests, to ensure that the battery equipment is operable for the long period and to allow the stand-by batteries to become appreciably discharged.

6 Claims, 3 Drawing Figures

TESTING EMERGENCY BATTERY EQUIPMENT

This invention relates to testing apparatus for testing battery powered lighting equipment which is adapted for energization on mains failure. Such light sources are required by modern fire and factory regulations to cause all routes in a building leading to exit points to be illuminated in the event of a mains failure. Since batteries do not have an infinite life, even when they are not used, it is important that such light sources should be tested to ensure that they will work when an emergency occurs. The light sources are often placed high up on walls or on ceilings, so that it is inconvenient to make the tests by applying a meter to the lighting fittings themselves.

The battery powered equipment is usually provided with a charging circuit energized by the mains, and with a switch responsive to the presence of the mains supply to switch off the charging circuit and to connect the batteries to energize the equipment on failure of the mains supply. It has been proposed to test battery light sources by removing the mains supply from them, and then to inspect each battery light source to check that it is giving the desired illumination. Such inspection is liable to error, since a failed light source will not be visible and may easily be missed. The present invention provides testing apparatus which automatically breaks the mains supply to the battery powered equipment at regular intervals and gives an indication when the output from the equipment is below a predetermined level. This indication may be given at a central point, in which case it will not be necessary for the inspector to visit all the equipment.

According to the invention there is provided testing apparatus for testing a stand-by battery powered lighting equipment which is adapted for energization in response to mains failure, the apparatus comprising a sensor means (sensor circuit) for sensing the light emitted by the stand-by equipment when activated and for indicating when the light emitted is below a predetermined value, a timing circuit for disconnecting the mains supply from the stand-by equipment automatically at regular intervals and a power supply circuit connected to the timing circuit for energizing the sensor means when the timing circuit has disconnected the mains supply. The sensor circuit may be adjustable so that the predetermined level may be adjusted.

When the stand-by equipment is a light source, the sensor is preferably a light sensor responsive to light from said light source to indicate when light from the light source is below a predetermined level. The sensor may include an optical fibre for conducting light from the light source to a convenient location for the rest of the testing apparatus.

A further timing circuit may be provided to break the mains supply for a longer period than that caused by the first-mentioned timing circuit after a predetermined number of said intervals. During this longer period, the batteries will become discharged to a greater extent, which is useful since batteries such as nickel cadmium cells have a longer life if they are discharged and recharged at regular intervals.

Examples of the invention will now be described with reference to the accompanying drawings in which.

Figure 1:
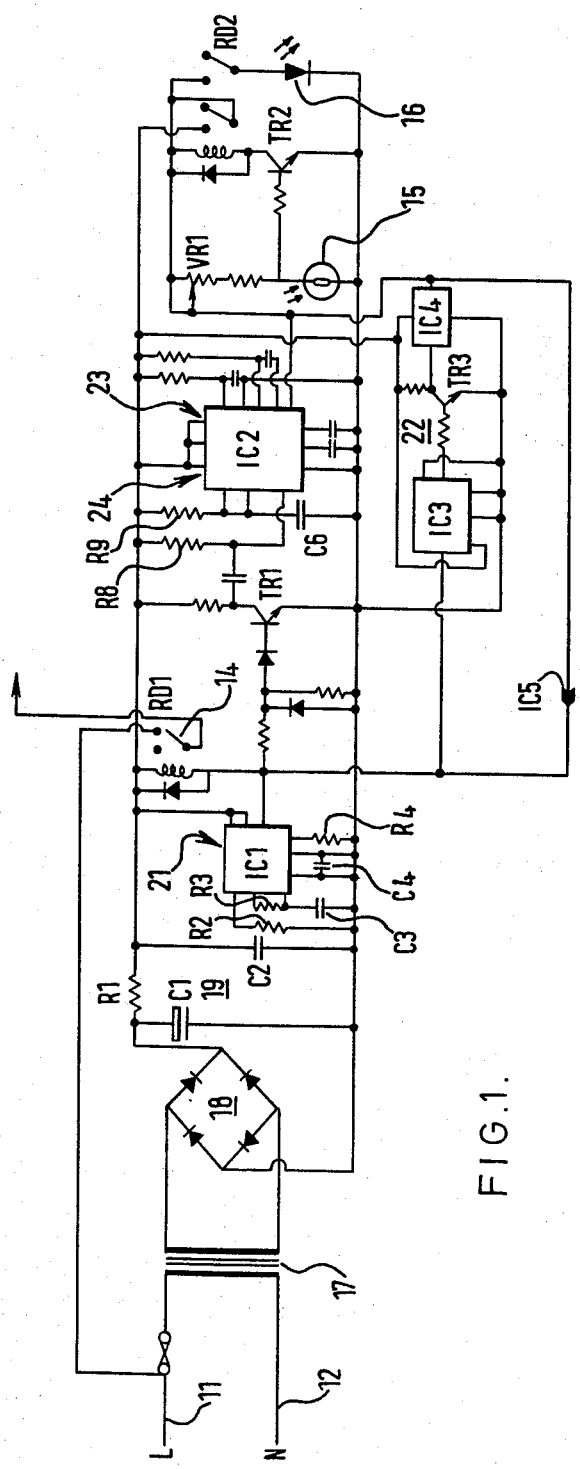
FIG. 1 is a circuit diagram of an emergency light testing device.

The light testing devices shown in the accompanying drawings perform similar functions. They receive a mains input on lines 11 and 12, they contain a switch 14 for controlling the energization of the battery charging circuit (not shown) and they contain an alarm lamp 16 energized when the level of illumination detected by the sensor 15 falls below a predetermined level.

Each circuit contains two timing devices, the first 21 being arranged to operate approximately every two weeks, and the second 22 being arranged to operate about every 20 weeks. On operation of the first timing device 21, the mains supply is removed from the battery charging circuit, which causes the batteries to change from their charging mode to their discharging mode in which they energize the battery operated emergency light. A first time delay circuit 23 causes the power to be removed from battery charging circuit for a first predetermined period, and a second time delay circuit 24 causes the light sensor 15 to be energized a short time after the removal of power from the battery charging circuit so as to allow the battery powered lamp to reach full performance. A latching circuit 25 causes the alarm lamp 16 to be energized until reset, even after the end of the period of the time delay 23.

The alarm lamp 16 may be located adjacent the battery operated emergency lamp, or the lamps 16 from a plurality of emergency lamps may be located at a central position.

Turning now to FIG. 1 in detail, mains power is supplied on the input lines 11 and 12 to a transformer 17 which produces 8 volts alternating current from its secondary winding which current is applied to a full wave diode rectifier 18 producing a 12 volt direct current output which is smoothed in a circuit 19 comprising capacitors C1 and C2 and resistor R1.

The timing device 21 comprises an integrated circuit IC1 (ZN1034E, see Radio Spares Information Sheet No. R2466), its time constant being governed by resistors R2, R3 and capacitor C3, and the self-triggering of the circuit being caused by components R4 and C4. The output of the circuit IC1 is a negative pulse, which energizes a reed relay RD1 whose contacts form the switch 14 between the live mains input 11 and the battery charging circuit (not shown). When the timing device 21 times out, the negative pulse energizes the coil of relay RD1, causing the switch contacts 14 to open, thus cutting off the charging circuit from the mains supply.

The output of circuit IC1 is also connected through a triggering inverting circuit including transistor TR1 (BC 148) to an integrated circuit IC2 (556, see Radio Spares Information Sheet No. R 2113) forming the time delay circuits 24 and 23 in series. The portion of the circuit IC2 forming the circuit 24 is controlled by resistors R8 and R9 and capacitor C6. The circuit 23 causes the light sensor 15 to be energized for a period of about three minutes after the short warming up delay of the circuit 24. If the sensor 15 senses a light output below a level controlled by the setting of potentiometer VR1, it causes the output of IC2 to energized transistor TR2 (BC 148) which energises a second reed relay RD2. This relay has two sets of contacts, the first set connecting the relay coil to the direct voltage supply from the smoothing circuit 19, thus holding the relay RD2 energized after the end of the period set by the circuit 23. A second set of contacts energizes the alarm lamp 16 which is in the form of a flashing light emitting diode to indicate a failure of the emergency lighting supply. The diode 16 will continue to be energised even after the restoration of the mains supply on de-energization of the relay RD1, since the relay RD2 has self-hold contacts. The diode 16 can be de-energized by manual re-setting of the relay RD2.

The integrated circuit IC1 causes the three-minute test to be carried out once every 2.7 weeks. The circuit of FIG. 1 also arranges for a longer-period test to be carried out at less frequent intervals, and the timing device 22 which controls the frequency and timing of the longer test comprises an integrated circuit IC3 (4017: see Radio Spares Information Sheet No. R2949) which acts as a divide-by-ten circuit on the output of circuit IC1 and triggers an integrated circuit IC4 (555: see Radio Spares Information Sheet No. R2113) through a phase inverting circuit including transistor TR3 (ZN3053). The negative output of IC3 is converted to a positive signal by TR3 to energize the circuit IC4, which energizes the light sensor 15 directly and the reed relay RD1 through a buffer integrated circuit IC5 (see Radio Spares Information Sheet No. R2949) for the period of one hour. The longer test of one hour is thus carried out in place of each tenth three-minute test, i.e. at 27 week intervals.

Figure 2:
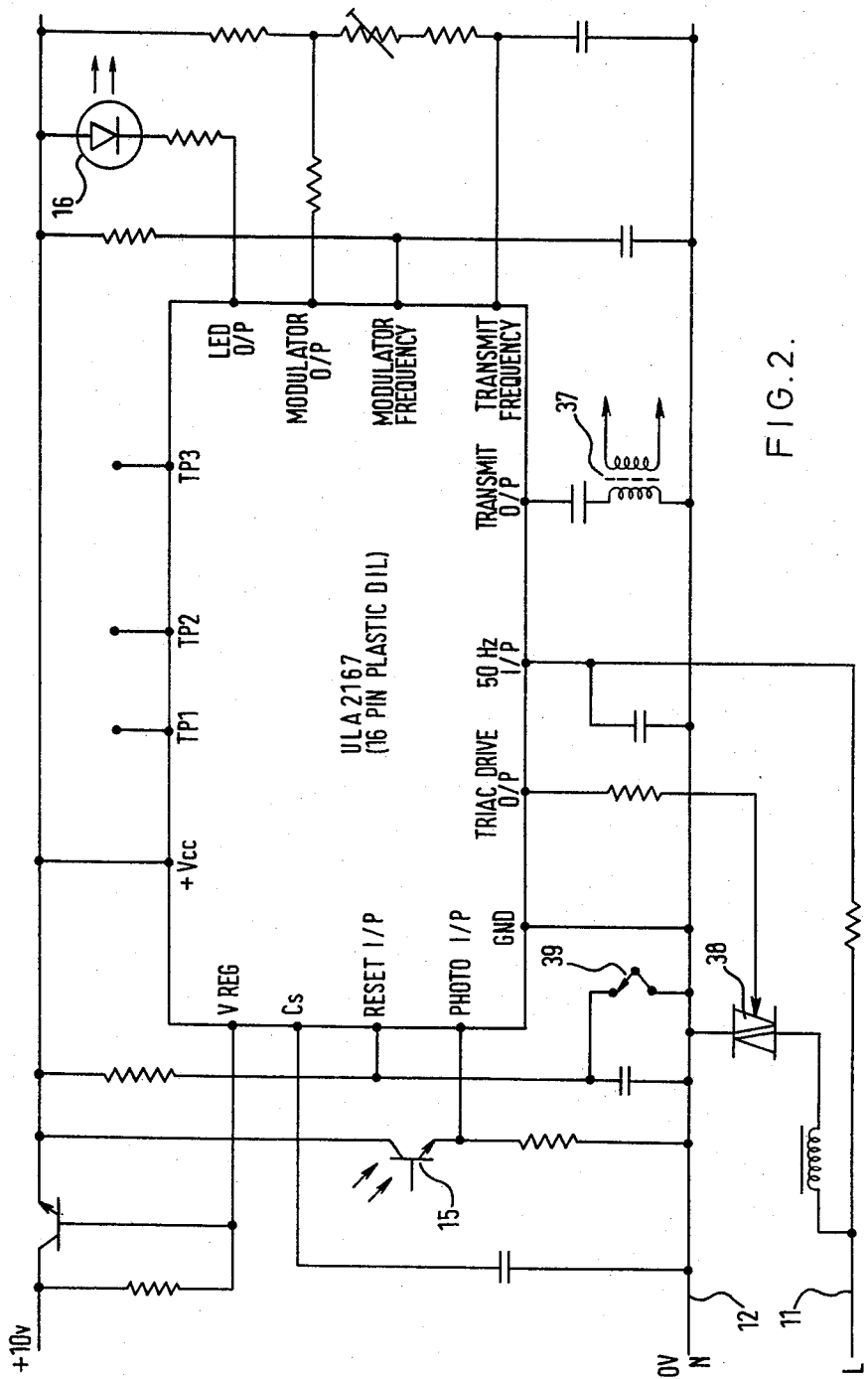
FIG. 2 is a circuit diagram of another emergency light testing device.
Figure 3:
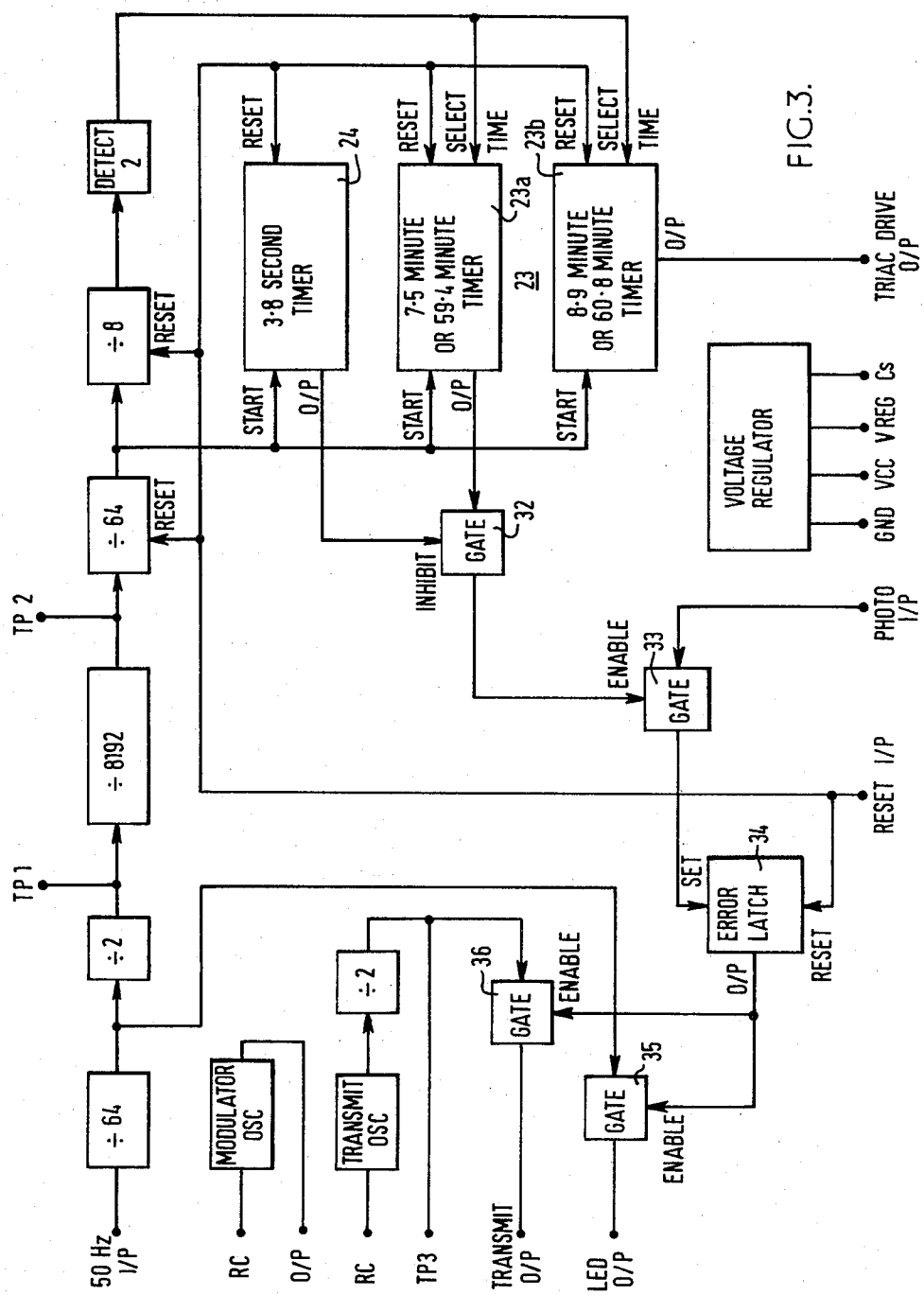
FIG. 3 is a detail of the circuit of FIG. 2.

In the arrangement of FIGS. 2 and 3, the reed relays are replaced by solid state devices and various timing and delay circuits are included in a single integrated circuit ULA2167. The mains supply on line 11 is connected to the 50 Hz input pin of the integrated circuit, and the mains frequency is in turn divided by 64, 2,8192, 64 and 8. It will be seen that the second division by 64 provides a pulse approximately once every two weeks, and this pulse is used to start the time delay circuit 24 which in this case is a 3.8 second timer, and the time delay circuit 23 which in this case comprises a first timer 23a which can selectively time out after 7.5 minutes or 59.4 minutes and a second timer 23b, which can selectively time out at 8.9 minutes or 60.8 minutes. The selection of the short or long time of the two portions of the delay circuit 23 is controlled by a detector which detects the second of every eight counts from the final dividing circuit of the chain operating on the mains frequency input so that after the whole circuit is reset the first time-out period of the circuit 23 will be the shorter period, the second will be the longer period, and the third to eighth will be the shorter period. The output from the time delay circuit 23a is fed through a gate 32 and inhibited during the initial 3.8 seconds to allow time for the emergency lighting to warm up, after which it is passed to enable a gate 33 controlling the output of the light sensor 15 energized by a separate ten volt direct voltage supply to set an error latching circuit 34. The circuit 34 provides an output until reset which is fed to enable two gates 35 and 36, the gate 35 when enabled connecting the initial division of the mains frequency (with a period of 1.28 seconds) to energize the diode 16, so that the diode 16 thus flashes with this period. The second gate 36 when enabled connects a transmitting oscillator frequency, divided by two for convenience through a transformer 37 to an output circuit. By setting the frequency of the transmitter oscillator for each emergency lighting device at a different carrier frequency, the inputs from a plurality of testing devices may be connected to the same wire for transmission to a central location, the identity of the failed battery equipment being identified by the carrier frequency of the signal received.

The second portion 23b of the time delay circuit is used to operate a triac 38 which connects a coil across the mains input lines 11 and 12, energisation of the coil causing de-energization of the battery charging circuit. At the start of each test, the triac will be energized by the circuit 23b so that the charging circuit is de-energized and the emergency battery lighting equipment brought into operation. After the 3.8 second delay, the light sensor 15 is energized and the test continues for 7.5 (or 59.4) minutes after the start of the test. The time delay circuit 23b continues the energization of the triac for a further 1.4 minutes before reconnecting the battery charging equipment to the mains supply to prevent any spurious failure indications being generated.

The timing out of the circuits 23 does not cancel the energization of the alarm lamp 16, since the latch circuit 34 remains latched. To cancel the alarm indication it is necessary to apply a re-set input to the latching circuit 34 by closing switch 39 and this should only be applied after the battery lighting equipment has been made serviceable. The re-set signal also re-sets the second divide by 64 circuit and the final divide by 8 circuit, so that the first subsequent test will be of the short period within the next two weeks, and the second test will be of the long period after a further two weeks.

The transmission of the failure signal from the output transformer 37 can be made over any convenient wire, for example a closed-circuit fire alarm, a pulsed clock system or a specially installed circuit exclusively for this purpose. As the output signal contains pulses of only milliwatts power, it should not affect any other circuits on the wire.

If the testing circuit should fail, the battery lighting equipment should still operate in the event of a mains failure, so that the testing system is fail-safe.

Optical fibres may be used to transmit light from the location of the stand-by equipment to a central station. The fibres may be used to transmit light from the battery equipment itself to a testing circuit at the central location, or they may be used to transmit light from diodes 16 of individual testing circuits at each location to the central location. If testing circuits are provided at the individual locations, it would be possible for the circuits to have a common set of timing devices, but individual sensors 15 and diodes 16.

The use of integrated circuits enables the testing circuits to occupy only a small volume, and thus they can be accommodated within the stand-by battery equipment if desired.

Test panels TP1, TP2 are provided on either side of the divide by 8192 divider in the chain of FIG. 2 to allow injection of alternating signals to test operation of the circuit. The injected signals are of a sufficiently high frequency to cause the tests to be carried out faster than every 2 or 16 weeks.

We claim:

1. Testing apparatus for testing stand-by battery powered lighting equipment which is adapted for energization in response to mains failure, the apparatus comprising an electrical circuit including a sensor means for sensing the visible light emitted by the stand-by equipment when activated, means for indicating when the light emitted is below a predetermined value, a timing circuit for disconnecting the mains supply from the stand-by equipment automatically at regular intervals and a power supply circuit connected to the timing circuit for energizing the sensor means when the timing circuit has disconnected the mains supply.

2. Apparatus as claimed in claim 1, wherein said indicating means includes means to adjust said predetermined value.

3. Apparatus as claimed in claim 1, wherein said apparatus is located at a central station, and comprises a plurality of optical fibres arranged respectively to receive light emitted from a plurality of stand-by battery powered lighting equipment.

4. Apparatus as claimed in claim 1 wherein said electrical circuit further comprises a further timing circuit for disconnecting the mains supply for a longer time than that caused by the first-mentioned timing circuit after a predetermined number of said intervals.

5. Apparatus as claimed in claim 1, comprising means for delaying activation of the said sensor means for a time after disconnection of said mains supply from the stand-by equipment.

6. Apparatus as claimed in claim 1, comprising means for connecting said mains supply to said stand-by equipment a given time after de-activation of said sensor means.

* * * * *